United States Patent
Hayashi

(10) Patent No.: US 7,554,868 B2
(45) Date of Patent: Jun. 30, 2009

(54) SEMICONDUCTOR MEMORY DEVICE

(75) Inventor: Mitsuaki Hayashi, Kyoto (JP)

(73) Assignee: Panasonic Corporation, Osaka (JP)

( * ) Notice: Subject to any disclaimer, the term of this patent is extended or adjusted under 35 U.S.C. 154(b) by 13 days.

(21) Appl. No.: 11/846,634

(22) Filed: Aug. 29, 2007

(65) Prior Publication Data
US 2008/0253211 A1    Oct. 16, 2008

(30) Foreign Application Priority Data
Nov. 8, 2006    (JP) .............................. 2006-302620

(51) Int. Cl.
*G11C 7/02* (2006.01)
(52) U.S. Cl. .............................. 365/210.1; 365/230.03; 365/230.08
(58) Field of Classification Search .................. 365/210, 365/230.06, 230.08
See application file for complete search history.

(56) References Cited

U.S. PATENT DOCUMENTS 5,959,920 A    9/1999 Kiyota
6,438,052 B1    8/2002 Sekine
2005/0041499 A1*    2/2005 Shibayama ............... 365/210
2007/0279981 A1*    12/2007 Abe et al. ................ 365/185.2

FOREIGN PATENT DOCUMENTS

JP    63116455    5/1988

* cited by examiner

*Primary Examiner*—Huan Hoang
(74) *Attorney, Agent, or Firm*—Dickinson Wright, PLLC

(57) ABSTRACT

A semiconductor memory cell is implemented in which the area of a row selection circuit is reduced and the effects of exposure, etching, and so on performed during manufacture are eliminated. The semiconductor memory device is provided with word line selection circuits connected with a row address signal line to select some desired word line according to an address input and dummy word line potential fixation circuits connected to word lines for dummy memory cells. As in the case of the word line selection circuits, the dummy word line potential fixation circuits each include a NAND gate NANDR(i) (i=−1, 0, m+1, or m+2) and an inverter INVR (i) (i=−1, 0, m+1, or m+2). The inputs of the dummy word line potential fixation circuits are connected with a row address signal line such that the word lines for the dummy memory cells are maintained in a non-selected state at all times. These make it possible to make the circuits which selectively drive all the word lines identical with each other in configuration, reduce the area of the row selection circuit, and eliminate the effects of exposure, etching, and so on during manufacture.

16 Claims, 9 Drawing Sheets

SEMICONDUCTOR MEMORY DEVICE

BACKGROUND OF THE INVENTION

1. Field of the Invention

The present invention relates to a semiconductor memory device which is suitable for implementing further scaledowns of electronic components and which fixes the potential of word lines or bit lines.

2. Background Art

As a means for reducing variations in the shapes of the memory cells of a semiconductor memory device, a method has been used by which the effects of exposure, etching, and so forth performed during its manufacture on the outermost memory cells of a memory array are eliminated through the utilization of the difference in layout pattern between the memory cells and other circuits caused by forming as dummy memory cells the same layout pattern as that of the memory cells around the perimeter of the memory array. In the following, a method for arranging dummy memory cells in a conventional semiconductor memory device and a method for fixing electric potential will be described with reference to some drawings.

FIG. 8 is a block diagram of the configuration of the conventional semiconductor memory device. The semiconductor memory device of FIG. 8 comprises a memory cell array 1, an input circuit 2, a row selection circuit 3, a column selection circuit 10, and a read/write circuit 11.

The memory cell array 1 comprises memory cells $MC(i, j)$ ($i=1$ to m and $j=1$ to n) arranged in matrix form and dummy memory cells $DC(i, j)$ ($i=-1$ to 0 and $j=-1$ to n+2, $i=m+1$ to m+2 and $j=-1$ to n+2, $i=1$ to m and $j=-1$ to 0, and $i=1$ to m and $j=n+1$ to n+2) arranged around the memory cells $MC(i, j)$. The memory cells $MC(i, j)$ and the dummy memory cells $DC(i, j)$ are connected to word lines $WL(i)$ ($i=-1$ to m+2) and bit lines $BL(j)$ ($j=-1$ to n+2).

The input circuit 2 outputs signals through a row address bus ADDR, a column address bus ADDC, and a control signal bus CONT to the row selection circuit 3, the column selection circuit 10, and the read/write circuit 11 according to signals from a plural-address input bus ADD and a plural-reading/writing-condition input bus MODE.

The row selection circuit 3, which receives the signal from the input circuit 2 via the row address bus ADDR, is connected to the word lines $WL(i)$ ($i=-1$ to m+2). The row selection circuit 3 makes one of the word lines $WL(i)$ ($i=1$ to m) transition to a selected state and makes the others transition to non-selected states according to the signal from the row address bus ADDR; the word lines $WL(i)$ ($i=-1, 0, m+1,$ and m+2) to which only the dummy memory cells are connected are fixed to non-selected states at all times.

The column selection circuit 10, which receives the signal from the input circuit 2 via the column address bus ADDC, is connected to the bit lines $BLj$ ($j=1$ to n) and the read/write circuit 11. The column selection circuit 10 provides electrical continuity between the read/write circuit 11 and the bit line $BLj$ ($j=1$ to n) through which reading or writing is to be performed of the bit lines $BLj$ ($j=1$ to n) according to the signal from the column address bus ADDC. The bit lines $BLj$ ($j=-1, 0, n+1,$ and n+2) to which only the dummy memory cells are connected are fixed to non-selected states at all times.

The read/write circuit 11, which receives the signal from the control signal bus CONT, is connected to the column selection circuit 10. At the time of writing, the read/write circuit 11 writes data inputted from a data input/output DATA 10 into the desired memory cell selected by the row selection circuit 3 and the column selection circuit 10 via the column selection circuit 10; at the time of reading, the read/write circuit 11 outputs data from the desired memory cell selected by the row selection circuit 3 and the column selection circuit 10 to the data input/output DATA 10 via the column selection circuit 10.

FIG. 9 is a circuit diagram of the row selection circuit 3 of the semiconductor memory device illustrated in FIG. 8. The row address bus ADDR comprises a row address signal line group ADDRa comprised of "a" pieces of row address selection signal lines, a row address signal line group ADDRb comprised of "b" pieces of row address selection signal lines, and a row address signal line group ADDRc comprised of "c" pieces of row address selection signal lines. Of each row address signal line group, only one of the row address selection signal lines is brought to a selected state (H level) and the other lines are brought to non-selected states (L levels). The inputs of three-input NAND gates $NANDR(i)$ ($i=1$ to m) are connected to the signal lines constituting the row address signal line groups ADDRa, ADDRb, and ADDRc to perform desired decoding; the outputs of the three-input NAND gates $NANDR(i)$ are connected to the inputs of inverters $INVR(i)$ ($i=1$ to m). The outputs of the inverters $INVR(i)$ ($i=1$ to m) are connected to the word lines $WL(i)$ ($i=1$ to m). And further, the output of individual two-input NAND gates $NANDR(i)$ ($i=-1, 0, m+1,$ and m+2) is connected to one of the two inputs of itself, to the input of individual inverters $INVR(i)$ ($i=-1, 0, m+1,$ and m+2), and to the input of individual inverters $INVRR(i)$ ($i=-1, 0, m+1,$ and m+2). The output of the individual inverters $INVRR(i)$ ($i=-1, 0, m+1,$ and m+2) is connected to the other input of the individual NAND gates $NANDR(i)$ ($i=1$ to m). The outputs of the inverters $INVR(i)$ ($i=-1, 0, m+1,$ and m+2) are connected to the word lines $WL(i)$ ($i=-1, 0, m+1,$ and m+2). Incidentally, in this example, when at the "H" level, the word lines $WL(i)$ ($i=-1,$ to m+2) are in the selected state, and when at the "L" level, they are in the non-selected state.

Therefore, by using, for example, a potential fixation circuit disclosed in Patent Reference 1 (Japanese Patent Laid-Open No. 63-116455 (Japanese Patent Application No. 61-262324)) in order to maintain the word lines to which only the dummy memory cells are connected in the non-selected state at all times, it is possible to form a configuration in which the gate of transistors constituting the circuits and the gates of transistors constituting the logic gates are not directly connected to power supply lines or ground lines. On account of this, such non-selected states can be realized owing to the fact the even when a gate oxide film has been thinned down due to the shrink of the device, the gate oxide film is not damaged by considerable potential fluctuations caused by static electricity from outside the semiconductor memory device.

The related art semiconductor memory device has problems described below. Generally, in order to shrink the area of a semiconductor memory device, there is a need for circuits which select and drive word lines to have all logic gates and inverters within the regions of memory cells and as a method for eliminating the effects of exposure, etching, and so on performed during manufacture as in the case of its memory array, there is a need to make circuits which fix the potential of dummy word lines to a non-selective potential and the circuits which select and drive the word lines other than the dummy word lines identical with each other and to do identical mask layouts.

However, in the related art semiconductor memory device, the logic gates included in the configuration of the dummy word line potential fixation circuits which fix the potential of the dummy word lines to a non-selective potential are larger in number than those included in the configuration of the word line selection circuits which select and drive the word lines other than the dummy word lines, and therefore there is a problem that since it is difficult to do the mask layout of the circuits within the region of the memory cells, the area of the semiconductor memory device cannot be minimized. In addition, since the dummy word line potential fixation circuits and the word line selection circuits differ in configuration and identical mask layouts cannot be done, there is a problem that the effects of exposure, etching, and so on performed during manufacture cannot be eliminated.

SUMMARY OF THE INVENTION

The present invention has been accomplished to solve the problems associated with the related art described above, and therefore an object of the invention is to provide a semiconductor memory device in which the gates of logic gates constituting dummy word line potential fixation circuits for fixing the potential of the dummy word lines to a non-selective potential are not directly connected to a power supply line or a ground line, it is possible to make the dummy word line potential fixation circuits and word line selection circuits for selecting and driving word lines other than the dummy word lines identical with each other in configuration, the area of a row selection circuit is reduced, and it is possible to eliminate the effects of exposure, etching, and so on performed during manufacture.

In order to attain the above object, a semiconductor memory device according to a first aspect of the invention is provided with a memory cell array comprised of memory cells arranged in matrix form and connected to word lines, dummy memory cells arranged in row and column directions so as to surround the memory cell array and having the same configuration as that of the memory cells, word line selection circuits connected with a row address signal line to select the desired word line according to an address input, and dummy word line potential fixation circuits connected to word lines for the dummy memory cells. The configuration of the dummy word line potential fixation circuits is the same as that of the word line selection circuits and the inputs of the dummy word line potential fixation circuits are connected with the row address signal line so as to bring the word lines for the dummy memory cells to a non-selected state at all times.

In such a configuration, the gates of logic gates constituting the dummy word line potential fixation circuits for fixing the potential of the word lines for the dummy memory cells to a non-selective potential are not directly connected to a power supply line or a ground line and it becomes possible to make the dummy word line potential fixation circuits identical with the word line selection circuits in configuration. Since both the circuits can be made identical with each other in configuration, it becomes possible to do identical mask layouts, thereby the area of the word line selection circuits can be reduced and the effects of exposure, etching, and so on performed during manufacture can be eliminated.

A semiconductor memory device according to a second aspect of the invention is identical with that according to the first aspect; the row address signal line is composed of plural row address signal line groups each composed of plural row address selection signal lines, only one of the row address selection signal lines is brought to a selected state, the word line selection circuits and the dummy word line potential fixation circuits each have plural inputs, the inputs of the dummy word line potential fixation circuits are connected to the row address selection signal lines of one of the row address signal line groups, and at least one of the inputs of each dummy word line potential fixation circuit is connected to the row address selection signal line to which the other input is not connected.

In this configuration, the potential of the dummy word lines can be fixed to a non-selective potential and the same effects as those described in the first aspect can be obtained.

A semiconductor memory device according to a third aspect of the invention is identical with that according to the first aspect in which the row address signal line is composed of the plural row address signal line groups each composed of the plural row address selection signal lines, only one of the row address selection signal lines is brought to the selected state, and the word line selection circuits and the dummy word line potential fixation circuits each have the plural inputs except that the outputs of the dummy word line potential fixation circuits are connected to the row address selection signal lines of the row address signal line groups and at least one of the row address selection signal lines connected to the inputs of the individual dummy word line potential fixation circuits is connected thereto so as to be brought to a non-selected state.

In this configuration, the potential of the dummy word lines can be fixed to the non-selective potential and the same effects as those described in the first aspect can be obtained. And further, since the inputs of each dummy word line potential circuit are not concentratedly connected to one of the row address selection signal lines, the load capacity of the wiring can be distributed to the plural row address selection signal lines, which makes it possible to obtain the effect of being capable of eliminating the difference in transition time between the row address selection signal lines connected to the dummy word line potential fixation circuits and the row address selection signal lines not connected to the dummy word line potential fixation circuits.

Semiconductor memory devices according to fourth to sixth aspects of the invention are identical with those according to the first to third aspects respectively; the row address signal lines connected to the inputs of the dummy word line potential fixation circuits transmit a low-order address.

In these configurations, even when their memory capacity has been increased or decreased, there is no need to change the connections of the inputs of the dummy word line potential fixation circuits, and therefore their memory capacity can be readily increased or decreased.

A semiconductor memory device according to a seventh aspect of the invention is provided with a memory cell array comprised of memory cells arranged in matrix form and connected to word lines and bit lines, dummy memory cells arranged in row and column directions so as to surround the memory cell array and having the same configuration as that of the memory cells, word line selection circuits connected with a row address signal line to select the desired word line according to an address input, and dummy word line potential fixation circuits connected to word lines for the dummy memory cells. The configuration of the dummy word line potential fixation circuits is the same as that of the word line selection circuits; a non-selective potential generation circuit, which receives signals inputted to the semiconductor memory device and outputs at all times signals with the same potential as that of the row address signal line in the non-selected state, is provided; and at least one of the inputs of each dummy word line potential fixation circuit is connected to the output of the non-selective potential generation circuit.

In this configuration, the gates of the logic gates constituting the dummy word line potential fixation circuits for fixing the potential of the word lines for the dummy memory cells to a non-selective potential are not directly connected to the power supply line or the ground line and it becomes possible to make the dummy word line potential fixation circuits identical with the word line selection circuits in configuration. Since both the circuits can be made identical with each other, identical mask layouts can be done, thereby the area of the word line selection circuits can be reduced and the effects of exposure, etching, and so on performed during manufacture can be eliminated. And furthermore, an input signal line for the dummy word line potential fixation circuits is not connected to the word line selection circuits, which makes it possible to obtain the effect of being capable of eliminating the difference in transition time between the input signal line and the row address selection signal lines connected to the word line selection circuits.

A semiconductor memory device according to an eighth aspect of the invention is identical with that according to the seventh aspect; the input of the non-selective potential generation circuit receives one of signals simultaneously inputted to the semiconductor memory device.

In this configuration, for example, either the signal from an address input bus or that from a reading/writing-condition input bus can be inputted thereto.

Semiconductor memory devices according to ninth and tenth aspects of the invention are identical with those according to the seventh and eighth aspects respectively; when an input received by the non-selective potential generation circuit is an address input, the address is a low-order address.

In this configuration, even when its memory capacity has been increased or decreased, there is no need to change the coupling between a row address signal inputted to the semiconductor memory device and a potential fixation signal inputted to the non-selective potential generation circuit, and therefore the memory capacity can be readily increased or decreased.

A semiconductor memory device according to an eleventh aspect of the invention is identical with that according to the seventh aspect; the non-selective potential generation circuit receives plural signals simultaneously.

A semiconductor memory device according to a twelfth aspect of the invention is identical with that according to the eleventh aspect; the plural signals inputted to the non-selective potential generation circuit differ in transition timing.

In this configuration, the false address signal line can be stably maintained in a non-selected state without being affected by signal transition times, wiring loads, and so on at the non-selective potential generation circuit.

A semiconductor memory device according to a thirteenth aspect of the invention is identical with that according to the twelfth aspect; the plural signals refer to two signals. In this configuration, the same effect as that described in the twelfth aspect can be obtained.

Semiconductor memory devices according to fourteenth to sixteenth aspects of the invention are identical with those according to the eleventh to thirteenth aspects respectively; when at least one of the inputs received by the non-selective potential generation circuit is address data, the address is a low-order address.

In these configurations, even when its memory capacity has been increased or decreased, there is no need to change the coupling between an address signal inputted to the semiconductor memory device and a potential fixation signal inputted to the non-selective potential generation circuit, and therefore the memory capacity can be readily increased or decreased.

DESCRIPTION OF THE EXEMPLARY EMBODIMENTS

Figure 1:
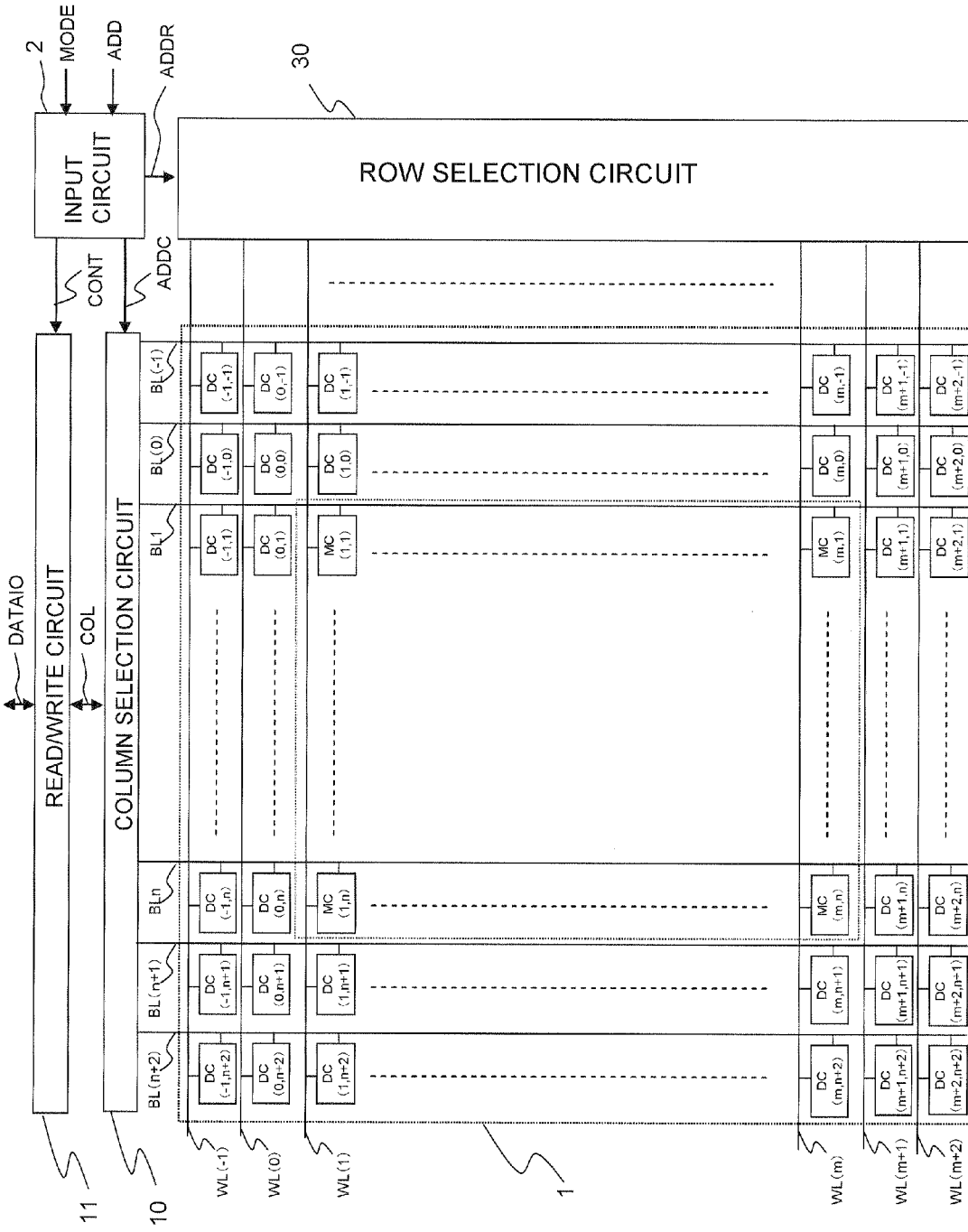
FIG. 1 is a block diagram of the configuration of a semiconductor memory device according to a first embodiment of the present invention.
Figure 2:
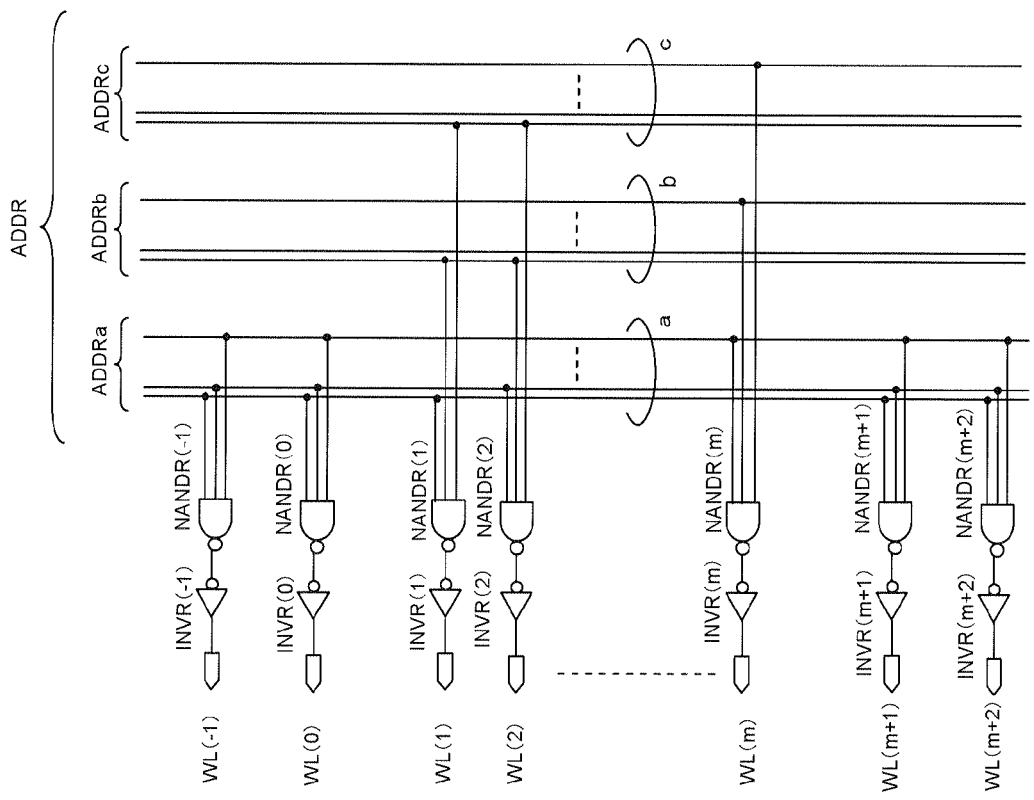
FIG. 2 is an illustration of the configuration of a row selection circuit according to the first embodiment of the invention.
Figure 8:
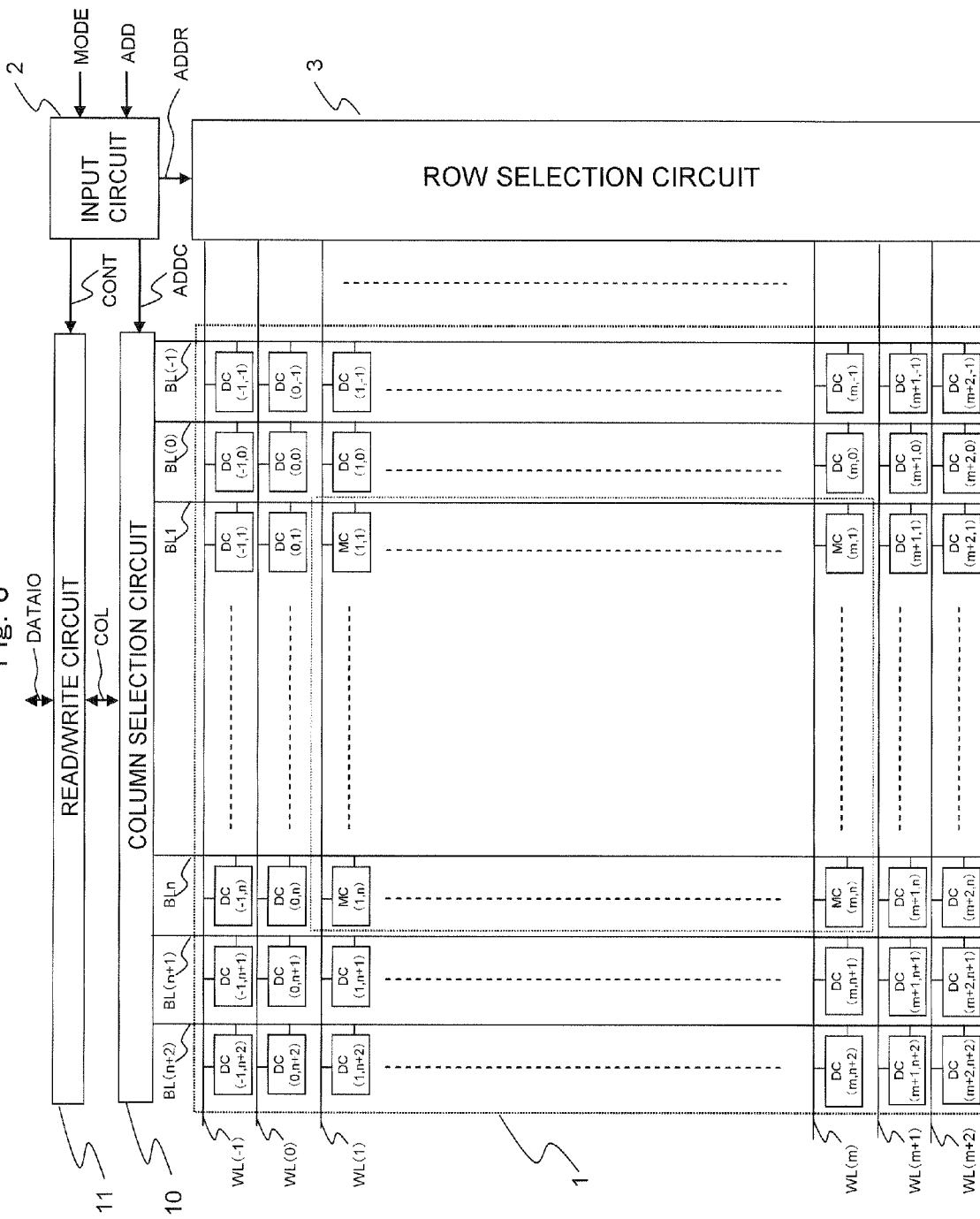
FIG. 8 is a block diagram of the configuration of a related art semiconductor memory device.
Figure 9:
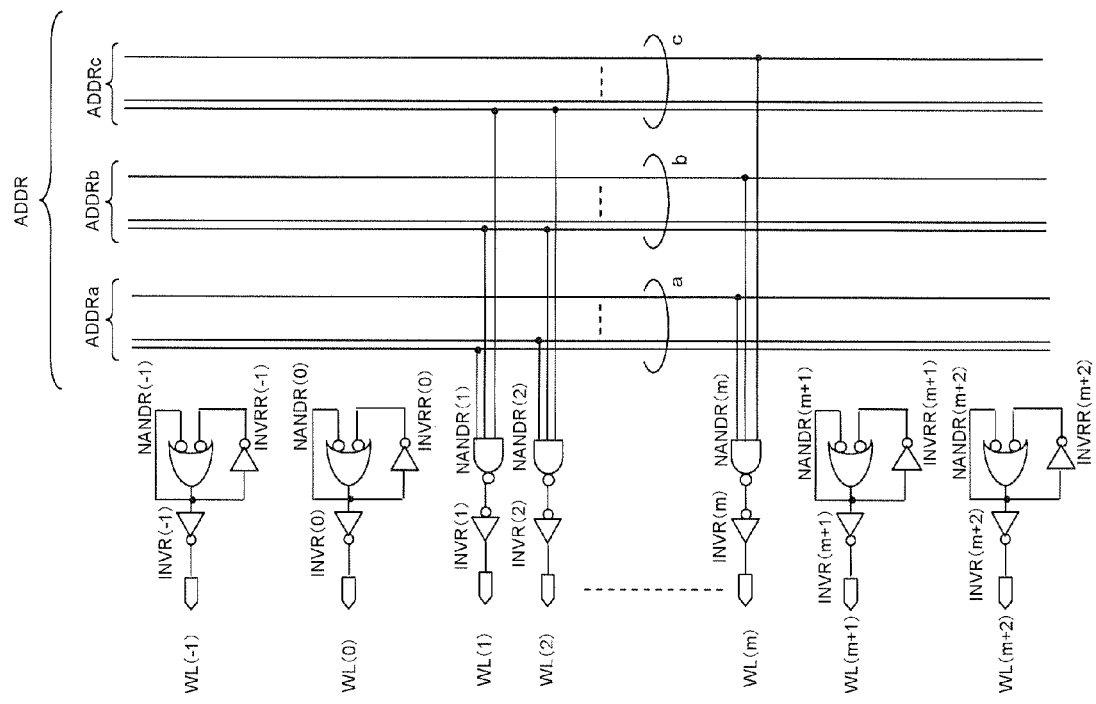
FIG. 9 is an illustration of the configuration of a row selection circuit included in the related art semiconductor memory device.

A first embodiment of the present invention will be described below with reference to FIGS. 1 and 2. FIG. 1 is a block diagram of the configuration of a semiconductor memory device according to the first embodiment of the invention, and FIG. 2 is a circuit diagram of the row selection circuit 30 of the semiconductor memory device according to the first embodiment of the invention. Incidentally, since the configuration illustrated in FIG. 1 is the same as that illustrated in FIG. 8, the components of the semiconductor memory device are denoted with the same reference numerals as those of FIG. 8 instead of repeating their explanation.

The row selection circuit 30 is provided with word line selection circuits, which are connected with a row address signal line to select the desired word line according to an address input, and dummy word line potential fixation circuits which are connected to the word lines for the dummy memory cells and which have the same configuration as that of the word line selection circuits. And further, the inputs of the dummy word line potential fixation circuits are connected with the row address signal line so that the word lines for the dummy memory cells are in the non-selected state at all times.

As shown in FIG. 2, the row address signal bus ADDR comprises the plural address signal line groups each comprised of the plural address signal lines (only one of the address signal lines is at the H level that means the selected state), the circuits for selecting and driving the dummy word lines (the dummy word line potential fixation circuits) each comprise the NAND gate NANDR(i) (i=−1, 0, m+1, or m+2) and the inverter INVR(i) (i=−1, 0, m+1, or m+2), and the circuits for selecting and driving the word lines other than the dummy word lines (the word line selection circuits) each comprise the NAND gate NANDR(i) (i=1 to m) and the inverter INVR(i) (i=1 to m). The inputs of the NAND gates of the circuits for selecting and driving the dummy word lines are connected to the address signal lines of one of the address signal line groups.

In this embodiment, the row selection circuit 30 comprises the three-input NAND gates NANDR(i) (i=−1 to m+2)—which receive signals from the row address bus ADDR comprised of the row address signal line group ADDRa comprised of the "a" pieces of row address selection signal lines, the row address signal line group ADDRb comprised of the "b" pieces of row address selection signal lines, and the row address signal line group ADDRc comprised of the "c" pieces of row address selection signal lines—and the inverters INVR(i) (i=−1 to m+1) with the inputs connected to the outputs of the NAND gates NANDR(i) (i=−1 to m+2) and with the outputs connected to the word lines WL(i) (i=−1 to m+2). Incidentally, the word lines WL(i) (i=−1, 0, m+1, and m+2) correspond with the dummy word lines described in the earlier section "Background Art".

The inputs of the individual three-input NAND gates NANDR(i) (i=1 to m) as the word line selection circuit are respectively connected to one of the row address selection signal lines of the row address signal line group ADDRa, one of the row address selection signal lines of the row address signal line group ADDRb, and one of the row address selection signal lines of the row address signal line group ADDRc such that the desired word line WL(i) (i=1 to m) is selected according to an address input. All the inputs of the three-input NAND gates NANDR(i) (i=−1, 0, m+1, and m+2) as the dummy word line potential fixation circuits are connected to the row address selection signal lines of the row address signal line group ADDRa; and besides at least one of the three inputs of the individual NAND gates NANDR(i) is connected to the row address selection signal line to which the other input is not connected.

As a result, since only one of the row address selection signal lines of the row address signal line group ADDRa is brought to the selected state (the H level), at least one of the three inputs of the individual three-inputs NAND gates NANDR(i) (i=−1, 0, m+1, and m+2) is necessarily brought to the non-selected state (the L level). Because of this, the outputs of the NAND gates NANDR(i) (i=−1, 0, m+1, and m+2) are at the H level at all times and the outputs of the inverters INVR (i) (i=−1, 0, m+1, and m+2) are at all times at the L level that means the non-selected state.

As described above, according to the first embodiment, the gates of the logic gates each constituting the dummy word line potential fixation circuit for fixing the potential of the dummy word line to a non-selective potential are not directly connected to the power supply line or the ground line, and since it becomes possible to make the dummy word line potential fixation circuits and the word line selection circuits for selecting and driving the word lines other than the dummy word lines identical with each other in configuration, it becomes possible to do identical mask layouts.

In this embodiment, since all the inputs of the three-input NAND gates NANDR(i) (i=−1, 0, m+1, and m+2) are connected to one of the row address selection signal lines of the row address signal line group ADDRa; however, by connecting the inputs of the individual three-input NAND gates NANDR(i) (i=−1, 0, m+1, and m+2) to the row address selection signal lines of the row address signal line group ADDRa in a one-to-one correspondence, the plural NAND gates are not concentratedly connected to one of the row address selection signal lines, and therefore the load capacity of the wiring can be distributed to the plural row address selection signal lines. This makes it possible to obtain the effect of being capable of eliminating the difference in transition time between the row address selection signal lines to which the NAND gates for fixing the potential of the dummy word lines are connected and the row address selection signal lines to which the NAND gates for fixing the potential of the dummy word lines are not connected.

Moreover, in this embodiment, all the inputs of the three-input NAND gates NANDR(i) (i=−1, 0, m+1, and m+2) are connected to the row address selection signal lines of the row address signal line group ADDRa, whereas the inputs of the dummy word line potential fixation circuits can also be connected to the row address selection signal lines of the other row address signal line groups and at least one of the row address selection signal lines connected to the inputs of each dummy word line potential fixation circuit can be connected thereto so as to be brought to the non-selected state. That is, even when at least two of the three inputs are connected to the row address selection signal lines of one of the row address signal line groups and the remaining input is connected to one of the row address selection signal line of the row address signal line group different from the row address signal line group to which the two inputs are connected, the same effect as that described above can be obtained.

Furthermore, in this embodiment, in a case where addresses have been assigned to the row address signal line groups ADDRa, ADDRb, and ADDRc in the order of from the lower-order address to the higher-order address, by connecting the inputs of the three-input NAND gates NANDR(i) (i=−1, 0, m+1, and m+2) to the row-order address signal line group, there is no need to change the connections of the inputs of the three-input NAND gates NANDR(i) (i=−1, 0, m+1, and m+2) thereto even when its memory capacity has been increased or decreased, and therefore it is possible to obtain the effect that the increase or decrease in the memory capacity can be readily accommodated.

Figure 3:
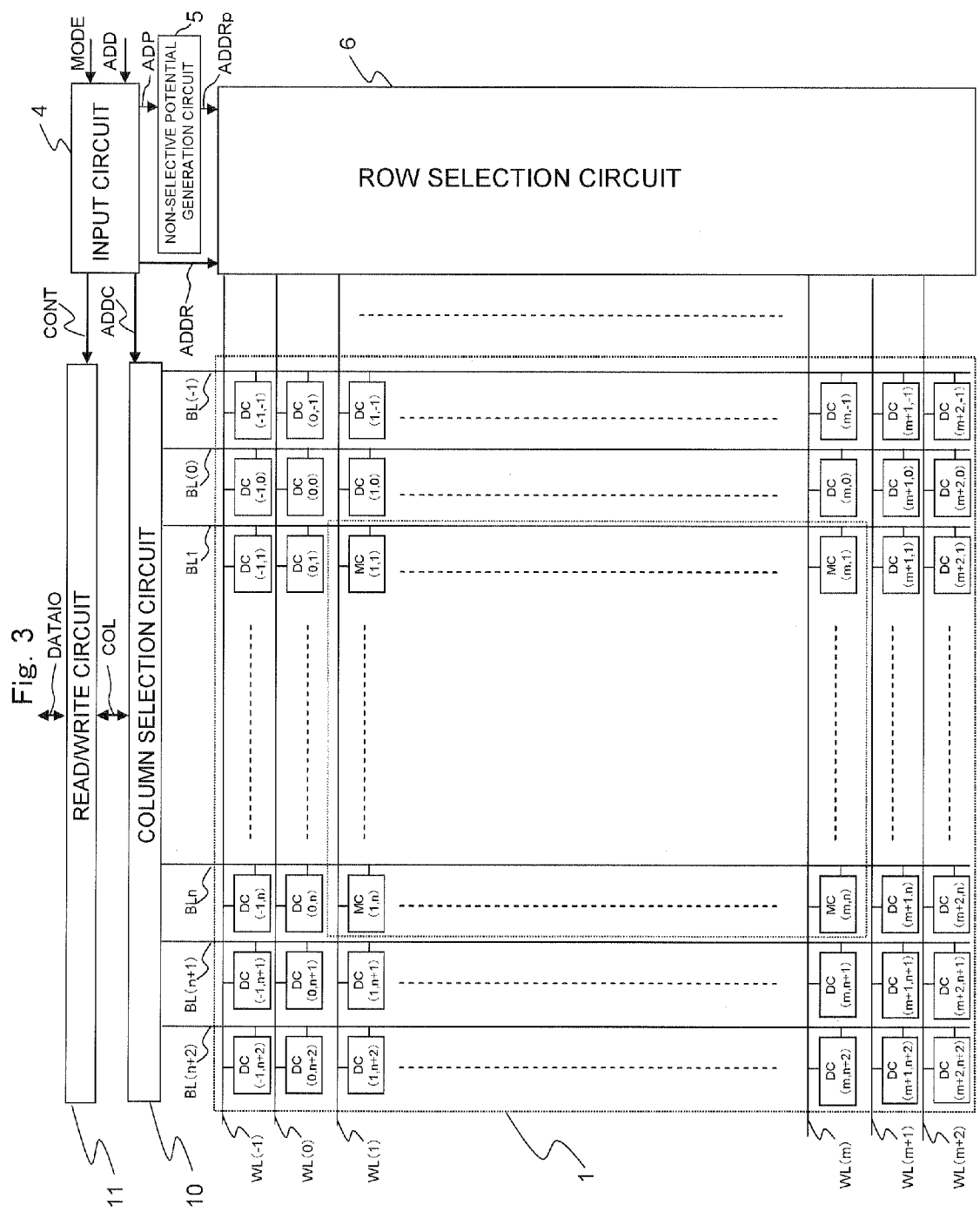
FIG. 3 is a block diagram of the configuration of a semiconductor memory device according to a second embodiment of the invention.

A second embodiment of the present invention will be described below with reference to FIGS. 3 to 5. FIG. 3 is a block diagram of the configuration of a semiconductor memory device according to the second embodiment of the invention.

As shown in FIG. 3, the semiconductor memory device according to the second embodiment comprises the memory cell array 1, an input circuit 4, a non-selective potential generation circuit 5, a row selection circuit 6, the column selection circuit 10, and the read/write circuit 11. Since the memory cell array 1, the column selection circuit 10, and the read/write circuit 11 are the same as those of the semiconductor memory device of FIG. 8 described in the earlier section "Background Art", they are denoted with the same reference numerals as those of FIG. 8 instead of repeating their explanation.

The row selection circuit 6 is provided with the word line selection circuits, which are connected with the row address signal line to select the desired word line according to an address input, and the dummy word line potential fixation circuits connected to the word lines for the dummy memory cells and having the same configuration as that of the word line selection circuits. And further, the non-selective potential generation circuit 5 receives signals inputted to the semiconductor memory device and outputs at all times signals with the same potential as that of the row address signal lines in the non-selected state; at least one of the inputs of each dummy word line potential fixation circuit is connected to the output of the non-selective potential generation circuit 5.

In this embodiment, the input circuit 4 outputs signals through a potential fixation signal line ADP, the row address bus ADDR, the column address bus ADDC, and the control signal bus CONT to the non-selective potential generation circuit 5, the row selection circuit 6, the column selection circuit 10, and the read/write circuit 11 according to signals from the plural-address input bus ADD and the plural-reading/writing-condition input bus MODE. In this case, the signal from the potential fixation signal line ADP is identical with either the signal from the address input bus ADD or that from the reading/writing-condition input bus MODE.

The non-selective potential generation circuit 5 receives the signal outputted from the input circuit 4 via the potential fixation signal line ADP and outputs a signal through a false address signal line ADDRp to the row selection circuit 6.

The row selection circuit 6, which receives the signal outputted from the input circuit 4 via the row address bus ADDR and the signal outputted from the non-selective potential generation circuit 5 via the false address signal line ADDRp, is connected to the word lines WL(i) (i=−1 to m+2). The row selection circuit 6 makes one of the word lines WL(i) (i=1 to m) transition to the selected state and makes the others transition to the non-selected state according to the signal from the row address bus ADDR. In addition, the word lines WL(i) (i=−1, 0, m+1, and m+2), to which only the dummy memory cells are connected, are fixed to the non-selected state at all times.

Figure 4:
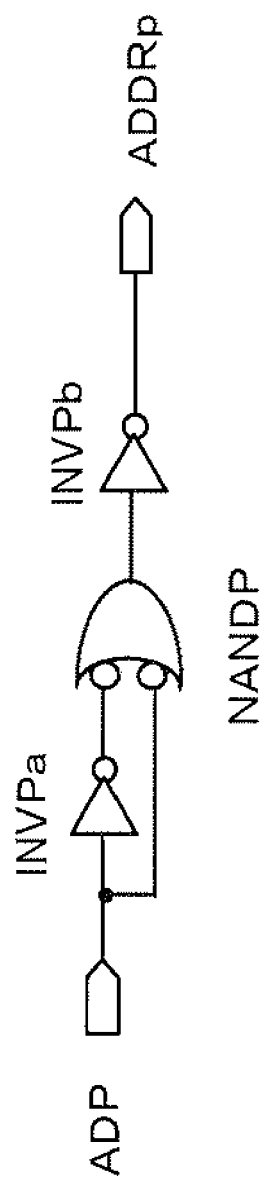
FIG. 4 is an illustration of the configuration of a potential fixation circuit according to the second embodiment of the invention.

FIG. 4 is a circuit diagram of the non-selective potential generation circuit 5 of the semiconductor memory device illustrated in FIG. 3. The signal from the input signal line ADP, which is identical with either the signal from the address input bus ADD or that from the reading/writing-condition input bus MODE, is inputted to the input of an inverter INVPa and one of the two inputs of a two-input NAND gates NANDP. A signal outputted from the inverter INVPa is inputted to the other input of the two-input NAND gate NANDP, a signal outputted from the two-input NAND gate NANDP is inputted to an inverter INVPb, and a signal outputted from the inverter INVPb is sent to the false address signal line ADDRp.

Figure 5:
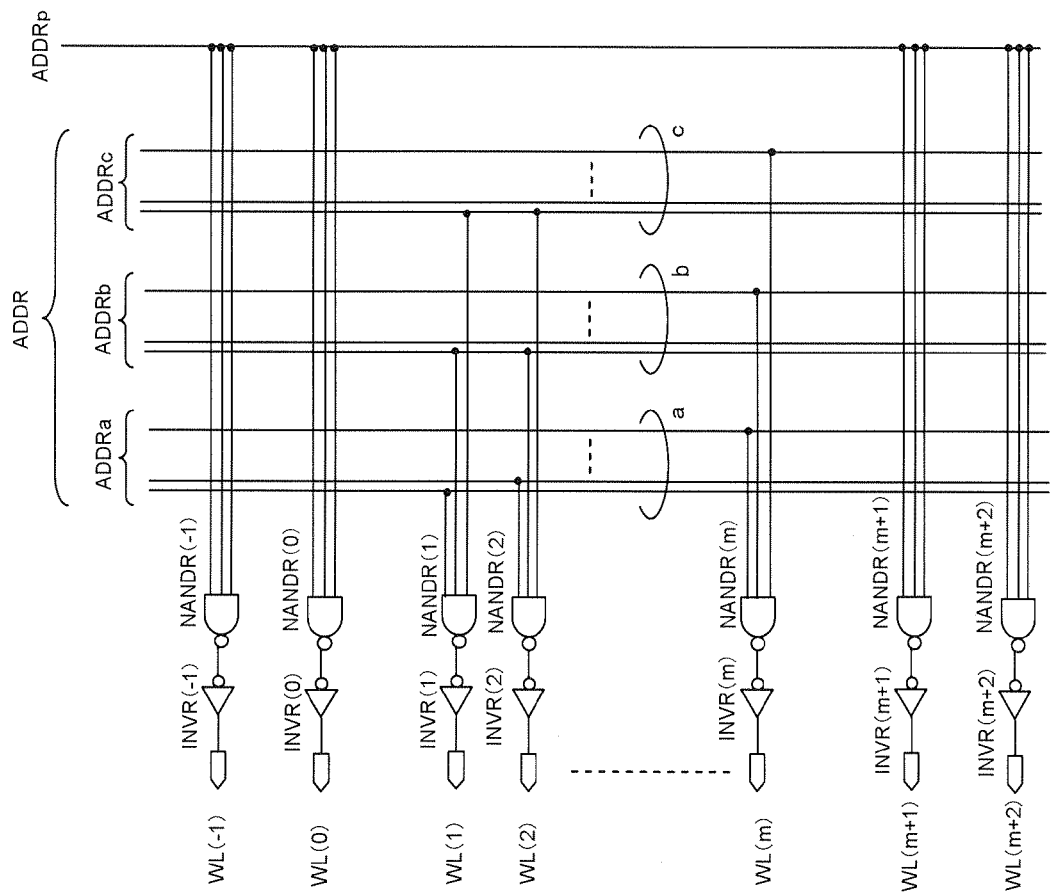
FIG. 5 is an illustration of the configuration of a row selection circuit according to the second embodiment of the invention.

FIG. 5 is a circuit diagram of the row selection circuit 6 of the semiconductor memory device illustrated in FIG. 3. The row selection circuit 6 of the semiconductor memory device according to the second embodiment differs from the row selection circuit 30 of the semiconductor memory device according to the first embodiment illustrated in FIG. 2 in that the false address signal line ADDRp is provided and all the outputs of the three-input NAND gates NANDR(i) (i=−1, 0, m+1 and m+2) are connected to the false address signal line ADDRp; since the other components and connections are the same as those in the row selection circuit 30 of FIG. 2, they are denoted with the same reference numerals as those of FIG. 2 instead of repeating their explanation.

As a result, even when signals sent from either the address input bus ADD or the reading-writing-condition input bus MODE to the potential fixation signal line ADP have transitioned to the H level or the L level, it becomes possible for the non-selective potential generation circuit 5 outputs signals at the L level to the false address signal line ADDRp at all times. Since all the inputs of the tree-input NAND gates NAND(i) (i=−1, 0, m+1, and m+2) are brought to the non-selected state (the L level) by the row selection circuit 6 of FIG. 5, the outputs of the NAND gates NANDR(i) (i=−1, 0, m+1, and m+2) are maintained at the H level at all times, and therefore the outputs of the inverters INVR(i) (i=−1, 0, m+1, and m+2) are maintained at all times at the L level that means the non-selected state.

Therefore, according to this embodiment, the gates of the logic gates constituting the dummy word line potential fixation circuits for fixing the potential of the dummy word lines to the non-selective potential are not directly connected to the power supply line or the ground line, and since it becomes possible to make the dummy word line potential fixation circuits and the word line selection circuits for selecting and driving the word lines other than the dummy word lines identical with each other in configuration, it becomes possible to do identical mask layouts. And further, since the inputs of the NAND gates for fixing the potential of the dummy word lines are not connected to the row address selection signal lines, it is possible to obtain the effect of being capable of completely eliminating the difference in transition time between the row address selection signal lines to which the NAND gates for fixing the potential of the dummy word lines are not connected and the false address signal line.

Furthermore, in this embodiment, when some address signal is sent from the address input bus ADD to the potential fixation signal line ADP, low-order address data is sent to the potential fixation signal line ADP. Because of this, even when its memory capacity has been increased or decreased, there is no need to change the input of the address signal from the address input bus ADD to the potential fixation signal line ADP, and therefore it is possible to obtain the effect that the increase or decrease in the memory capacity can be readily accommodated.

Figure 6:
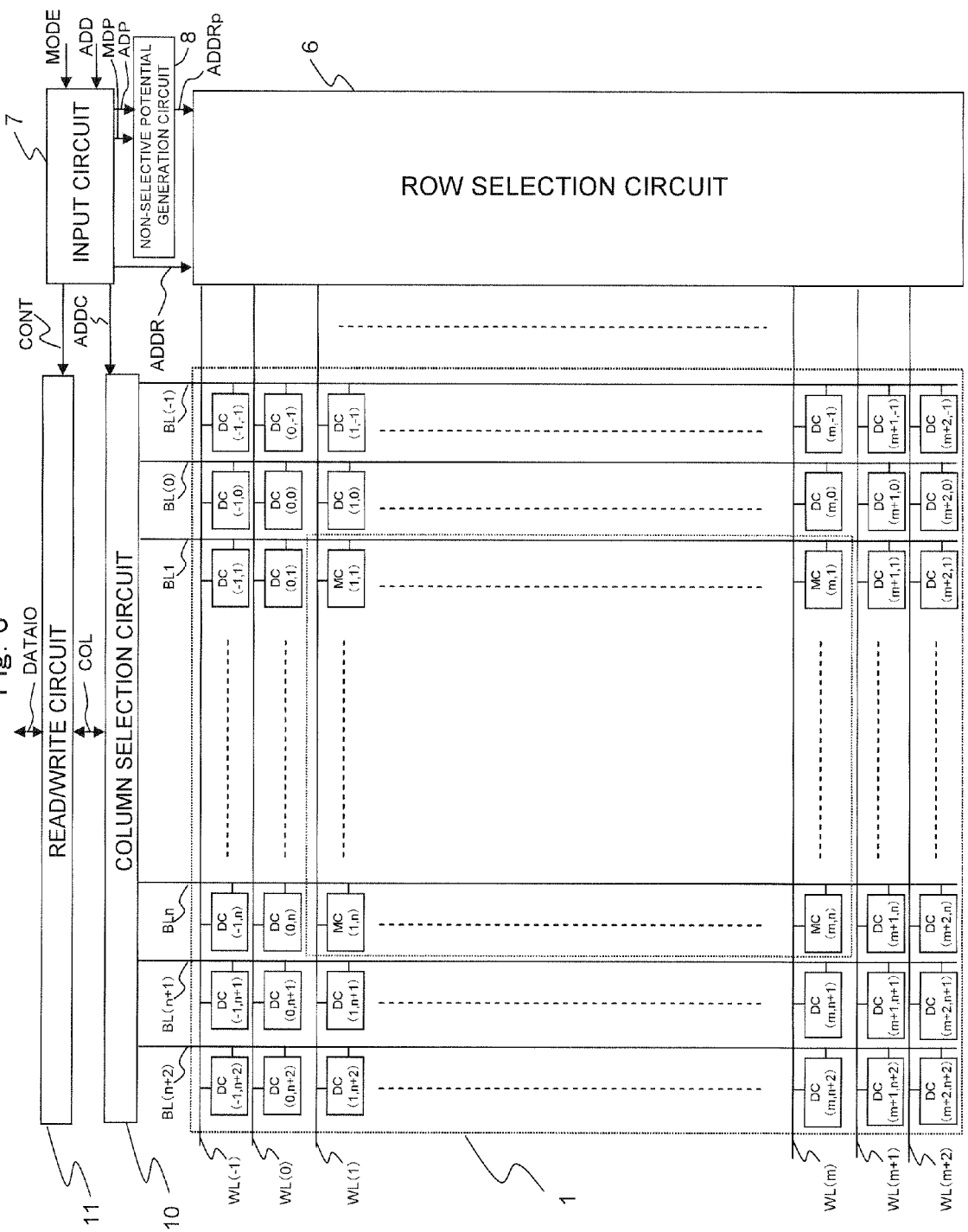
FIG. 6 is a block diagram of the configuration of a semiconductor memory device according to a third embodiment of the invention.

A third embodiment of the present invention will be described below with reference to FIGS. 6 and 7. FIG. 6 is a block diagram of the configuration of a semiconductor memory device according to the third embodiment of the invention.

As shown in FIG. 6, the semiconductor memory device according to the third embodiment comprises the memory cell array 1, the row selection circuit 6, an input circuit 7, a non-selective potential generation circuit 8, the column selection circuit 10, and the read/write circuit 11. Since the memory cell array 1, the column selection circuit 10, and the read/write circuit 11 are the same as those of the semiconductor memory device of FIG. 8 described in the earlier section "Background Art" and since the row selection circuit 6 is the same as that described in the second embodiment, they are denoted with the same reference numerals instead of repeating their explanation. In addition, as in the case of the second embodiment, the non-selective potential generation circuit 8 receives signals inputted to the semiconductor memory device and outputs at all times signals with the same potential as that of the row address signal lines in the non-selected state; at least one of the inputs of each dummy word line potential fixation circuit is connected to the output of the non-selective potential generation circuit 8.

In this case, the input circuit 7 outputs signals through the row address bus ADDR, the potential fixation signal line ADP, a potential fixation signal line MDP, the column address bus ADDC, and the control signal bus CONT to the row selection circuit 6, the non-selective potential generation circuit 8, the column selection circuit 10, and the read/write circuit 11 according to signals from the plural-address input bus ADD and the plural-reading/writing-condition input bus MODE. Incidentally, the signals through the potential fixation signal lines ADP and MDP are identical with either the signal from the address input bus ADD or that from the reading/writing-condition input bus MODE; and besides the signal inputted to the potential fixation signal line ADP and that inputted to the potential fixation signal line MDP differ in transition timing.

The non-selective potential generation circuit 8 receives the signals from the input circuit 7 via the potential fixation signal lines ADP and MDP and outputs a signal through the false address signal line ADDRp to the row selection circuit 6.

Figure 7:
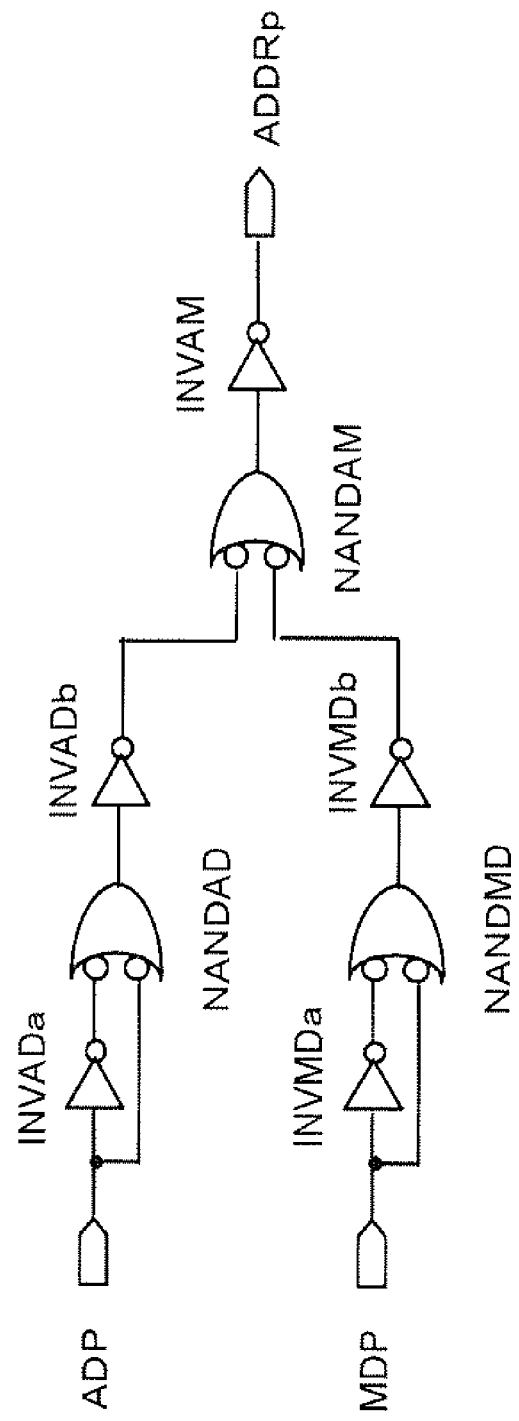
FIG. 7 is an illustration of the configuration of a potential fixation circuit according to the third embodiment of the invention.

FIG. 7 is a circuit diagram of the non-selective potential generation circuit 8 of the semiconductor memory device illustrated in FIG. 6. Either the signal from the address input bus ADD or that from the reading/writing-condition input bus MODE is sent to the potential fixation signal line ADP, the signal is dividedly inputted to the input of an inverter INVADa and one of the two inputs of a two-input NAND gate NAN-DAD, a signal outputted from the inverter INVADa is inputted to the other input of the two-input NAND gate NANDAD, and a signal outputted from the two-input NAND gate NAN-DAD is inputted to an inverter INVADb. Either the signal from the address input bus ADD or that from the reading/writing-condition input bus MODE is sent to the potential fixation signal line MDP (the signal sent to the potential fixation signal line MDP differs in transition timing from that sent to the potential fixation signal line ADP), the signal is dividedly inputted to the input of an inverter INVMDa and one of the two inputs of a two-input NAND gate NANDMD, a signal outputted from the inverter INVMDa is inputted to the other input of the two-input NAND gate NANDMD; and a signal outputted from the two-input NAND gate NANDMD is inputted to an inverter INVMDb. A signal outputted from the inverter INVADb is inputted to one of the two inputs of a two-input NAND gate NANDAM, a signal outputted from the inverter INVMDb is inputted to the other input of the two-input NAND gate NANDAM; a signal outputted from the two-input NAND gate NANDAM is inputted to the input of an inverter INVAM, and a signal outputted from the inverter INVAM is sent to the false address signal line ADDRp.

Even when signals sent from either the address input bus ADD or the reading/writing-condition input bus MODE to the potential fixation signal line ADP have transitioned to the H level or the L level, the output of the inverter INVADb of the non-selective potential generation circuit 8 is at the L level at all times; likewise, signals sent from either the address input bus ADD or the reading/writing-condition input bus MODE to the potential fixation signal line ADP have transitioned to the H level or the L level, the output of the inverter INVMDb is at the L level at all times; therefore signals from the false address signal line ADDRp can be maintained at the L level at all times.

In this case, since the two-input NAND gate NANDAM receives two types of signals differing in transition timing originally sent from the potential fixation signal lines ADP and MDP, signals from the false address signal line ADDRp can be stably maintained at the L level. This is because, for example, even when the potential of signals from the two-input NAND gate NANDAD have become unstable temporarily at the time of the transition of signals from the potential fixation signal line ADP and signals at the H level have been outputted from the inverter INVADb at worst, the inverter INVMDb which receives signals originally sent from the potential fixation signal line MDP outputs signals at the L level.

As a result, at the row selection circuit 6 of FIG. 5, all the outputs of the three-input NAND gates NANDR(i) (i=−1, 0, m+1, and m+2) connected to the false address signal line ADDRp are brought to the non-selective state (the L level). Therefore the outputs of the NAND gates NANDR(i) (i=−1, 0, m+1, and m+2) are at the H level at all times, and the outputs of the inverters INVR(i) (i=−1, 0, m+1, and m+2) are at all times at the L level that means the non-selected states.

Thus, according to the embodiment, the gates of the logic gates constituting the dummy word line selection circuits for fixing the potential of the dummy word lines to the non-selective potential are not directly connected to the power supply line or the ground line, and since it becomes possible to make the dummy word line potential fixation circuits and the word line selection circuits for selecting and driving the word lines other than the dummy word lines identical with each other in configuration, it becomes possible to do identical mask layouts. And further, since the inputs of the NAND gates for fixing the potential of the dummy word lines are not connected to the row address selection signal lines, it is possible to obtain the effect of being capable of completely eliminating the difference in transition time between the false address signal line and the row address selection signal lines to which the NAND gates for fixing the potential of the dummy word lines are not connected. In addition, the false address signal line can be stably kept in the non-selected state without being affected by signal transition times, wiring loads, and so on at a power supply fixation circuit.

Furthermore, in this invention, when some address signal is sent from the address input bus ADD to the potential fixation signal line ADP, a low-order address signal is sent to the potential fixation signal line ADP. Because of this, even when its memory capacity has been increased or decreased, there is no need to change the transmission of the address signal from the address input bus ADD to the potential fixation signal line ADP, and therefore it is possible to obtain the effect that the increase or decrease in the memory capacity can be readily addressed.

The invention claimed is:

1. A semiconductor memory device comprising:
a memory cell array comprised of memory cells arranged in matrix form and connected to word lines and bit lines;
dummy memory cells arranged in row and column directions so as to surround the memory cell array and having the same configuration as that of the memory cells;
word line selection circuits connected with a row address signal line to select a desired word line according to an address input; and
dummy word line potential fixation circuits connected to word lines for the dummy memory cells, wherein
the configuration of the dummy word line potential fixation circuits is the same as that of the word line selection circuits and the inputs of the dummy word line potential fixation circuits are connected with the row address signal line so as to bring the word lines for the dummy memory cells to a non-selected state at all times.

2. The semiconductor memory device according to claim 1, wherein the row address signal line is composed of plural row address signal line groups each composed of plural row address selection signal lines, only one of the row address selection signal lines is brought to a selected state, the word line selection circuits and the dummy word line potential fixation circuits each have plural inputs, the inputs of the dummy word line potential fixation circuits are connected to the row address selection signal lines of one of the row address signal line groups, and at least one of the inputs of the individual dummy word line potential fixation circuits is connected to the row address selection signal line to which the other input is not connected.

3. The semiconductor memory device according to claim 2, wherein the row address signal line connected to the inputs of the dummy word line potential fixation circuits transmits a low-order address.

4. The semiconductor memory device according to claim 1, wherein the row address signal line is composed of plural row address signal line groups each composed of plural row address selection signal lines, only one of the row address selection signal lines is brought to a selected state, the word line selection circuits and the dummy word line potential fixation circuits each have plural inputs, the inputs of the dummy word line potential fixation circuits are connected to the row address selection signal lines of the row address signal line groups, and at least one of the row address selection signal lines connected to the inputs of the individual dummy word line potential fixation circuits is connected thereto so as to be brought to a non-selected state.

5. The semiconductor memory device according to claim 1, wherein the row address signal line connected to the inputs of the dummy word line potential fixation circuits transmits a low-order address.

6. The semiconductor memory device according to claim 4, wherein the row address signal line connected to the inputs of the dummy word line potential fixation circuits transmits a low-order address.

7. A semiconductor memory device comprising:
   a memory cell array comprised of memory cells arranged in matrix form and connected to word lines and bit lines;
   dummy memory cells arranged in row and column directions so as to surround the memory cell array and having the same configuration as that of the memory cells;
   word line selection circuits connected with a row address signal line to select a desired word line according to an address input; and
   dummy word line potential fixation circuits connected to word lines for the dummy memory cells, wherein
   the configuration of the dummy word line potential fixation circuits is the same as that of the word line selection circuits,
   a non-selective potential generation circuit, which receives signals inputted to the semiconductor memory device and outputs at all times signals with the same potential as that of the row address signal line in a non-selected state, is provided, and at least one of the inputs of the individual dummy word line potential fixation circuits is connected to the output of the non-selective potential generation circuit.

8. The semiconductor memory device according to claim 7, wherein the input of the non-selective potential generation circuit receives one of signals simultaneously inputted to the semiconductor memory device.

9. The semiconductor memory device according to claim 8, wherein when an input received by the non-selective potential generation circuit is an address input, the address is a low-order address.

10. The semiconductor memory device according to claim 7, wherein when an input received by the non-selective potential generation circuit is an address input, the address is a low-order address.

11. The semiconductor memory device according to claim 7, wherein the non-selective potential generation circuit receives plural signals simultaneously.

12. The semiconductor memory device according to claim 11, wherein when at least one of the inputs received by the non-selective potential generation circuit is an address input, the address is a low-order address.

13. The semiconductor memory device according to claim 11, wherein the plural signals simultaneously inputted to the non-selective potential generation circuit differ in transition timing.

14. The semiconductor memory device according to claim 13, wherein when at least one of the inputs received by the non-selective potential generation circuit is an address input, the address is a low-order address.

15. The semiconductor memory device according to claim 13, wherein the plural signals refer to two signals.

16. The semiconductor memory device according to claim 15, wherein when at least one of the inputs received by the non-selective potential generation circuit is an address input, the address is a low-order address.

* * * * *